United States Patent [19]
DePriest

[11] Patent Number: 4,814,203
[45] Date of Patent: Mar. 21, 1989

[54] VAPOR DEPOSITION OF ARSENIC
[75] Inventor: Robert N. DePriest, Columbia, S.C.
[73] Assignee: Ethyl Corporation, Richmond, Va.
[21] Appl. No.: 156,312
[22] Filed: Feb. 16, 1988

Related U.S. Application Data

[63] Continuation-in-part of Ser. No. 912,800, Sep. 29, 1986, abandoned.
[51] Int. Cl.$^4$ ............................................. C23C 16/00
[52] U.S. Cl. ................... 427/248.1; 427/255; 427/255.1
[58] Field of Search ............ 427/248.1, 255.2, 255.1, 427/255; 423/87, 88, 111, 617

[56] References Cited

U.S. PATENT DOCUMENTS

| | | | |
|---|---|---|---|
| 3,101,280 | 4/1961 | Harrison et al. | 427/255.2 |
| 3,218,203 | 10/1961 | Ruehrwein | 148/175 |
| 3,224,913 | 12/1965 | Ruehrwein | 148/175 |
| 3,226,270 | 9/1963 | Miederer et al. | 148/174 |
| 3,261,726 | 10/1961 | Ruehrwein | 148/33.4 |
| 3,312,570 | 4/1967 | Ruehrwein | 148/175 |
| 3,312,571 | 4/1967 | Ruehrwein | 148/175 |
| 3,342,551 | 9/1967 | Dotzer | 423/299 |
| 3,364,084 | 1/1968 | Ruehrwein | 148/175 |
| 3,462,323 | 8/1969 | Groves | 148/175 |
| 4,250,205 | 2/1981 | Constant et al. | 427/248.1 |

OTHER PUBLICATIONS

Manasevit, Proc. SPIE–Int. Soc. Opt. Eng., 1982, vol. 323, pp. 94–99.
Chemical Engineering, Jan. 6, 1964, pp. 110–112.
Chattergee et al., Journal de Physique, 1982, vol. 43, No. 12, C5–491–C5–503.
Griffiths, Chemical and Industry, 1985, pp. 247–251.
Manasevit, Journal of Crystal Growth, 1981, vol. 55, pp. 1–9.
Dehn, American Chemical Journal, vol. 40, pp. 113 and 117–118 (1908).
Didchenko et al., J. Inorg. Nucl. Chem., 1960, vol. 14, 35–37.
Mori et al., Japan Ann. Rev. Electron. Comput. Telecommun., 1983, pp. 35–47.
Brochure entitled, "Organometallics for Vapor Phase Epitaxy" by Alfa Products, part of Morton Thiokol, Inc., pp. 1–97.
Raiziss et al., "Organic Arsenical Compounds", American Chemical Society Monograph, 1923, pp. 36–98.
Dehn, American Chemical Journal, vol. 33, pp. 120 and 143, 1905.

*Primary Examiner*—Sadie Childs
*Attorney, Agent, or Firm*—John F. Sieberth

[57] ABSTRACT

In a vapor deposition process (e.g. MOCVD) for producing an arsenic-containing film on a substrate by thermally decomposing at least a vaporous organo arsenic compound upon a heated substrate, the improvement wherein the organo arsenic compound consists essentially of a $C_1$ to $C_3$ monoalkylarsine carried to the heated substrate by means of a flow of an inert carrier gas.

7 Claims, No Drawings

VAPOR DEPOSITION OF ARSENIC

REFERENCE TO RELATED APPLICATION

This is a continuation-in-part of prior copending application Ser. No. 912,800 filed Sept. 29, 1986 now abandoned.

FIELD

This invention relates to improved vapor deposition processes. More particularly, this invention deals with improved vapor deposition processes for producing arsenic-containing films on a substrate, including for example production of arsenic-containing films of III-V compounds on a substrate by metal organic chemical vapor deposition (MOCVD) processes.

BACKGROUND

MOCVD processes for producing III-V films on various substrates are well known and well documented in the literature. A few references to this subject, all disclosures of which are incorporated herein by reference, include:
U.S. Pat. No. 3,101,280 to Harrison et al
U.S. Pat. No. 3,218,203 to Ruehrwein
U.S. Pat. No. 3,224,913 to Ruehrwein
U.S. Pat. No. 3,226,270 to Miederer et al
U.S. Pat. No. 3,261,726 to Ruehrwein
U.S. Pat. No. 3,312,570 to Ruehrwein
U.S. Pat. No. 3,312,571 to Ruehrwein
U.S. Pat. No. 3,342,551 to Dotzer
U.S. Pat. No. 3,364,084 to Ruehrwein
U.S. Pat. No. 4,368,098 to Manasevit
U.S. Pat. No. 4,404,265 to Manasevit To obtain optimum MOCVD coatings a number of factors have been considered, such as substrate surface condition or treatment, deposition rate, occurrence of side reactions, physical state of the metal organic, pyrolysis temperature, and the like. On the basis of these and other various factors, arsine ($AsH_3$) and trimethylarsine ($Me_3As$) have been used in recent years as the arsenic source materials. However in order to obtain the desired purity and quality of MOCVD-grown materials, it has been found necessary to carefully regulate $AsH_3$ over pressure as well other operating conditions.

THE INVENTION

In accordance with this invention a new type of arsenic source compounds is utilized in vapor deposition processes such as MOCVD. These compounds have been found to form or deposit purer arsenic than trimethylarsine, they are liquids at room temperature and thus are much easier and safer to handle and use than arsine (which is a gas at temperatures above $-55°$ C.), they have a lower volatility than arsine and are thus less likely to cause problems with pressurized storage vessels, they have volatilities well suited for vapor deposition processes such as MOCVD, and they are readily produced in high purity by known process technology.

The new source materials for high purity arsenic used pursuant to this invention are monoalkylarsines which may be represented by the general formula:

$RAsH_2$ where R is an alkyl group containing up to three carbon atoms, and preferably from 2 to 3 carbon atoms. Ethylarsine ($EtAsH_2$) and propylarsine ($PrAsH_2$) are particularly preferred arsenic source materials for use in the practice of this invention, although use may be made of methylarsine ($MeAsH_2$) or isopropylarsine ($i-PrAsH_2$).

Various embodiments of this invention are set forth in the ensuing claims.

Monoalkylarsines are readily prepared by a relatively simple two-step procedure. In the first step an alkyl arsonate salt is formed by reaction among an alkyl halide, arsenous oxide, and a metal base (e.g., NaOH, KOH, etc.). See Quick et al *J. Am. Chem. Soc.*, 1922, 805-16. In the second step the alkyl arsonic acid is reduced for example with zinc and hydrochloric acid. Note Raiziss and Gavron, *Organic Arsenical Compounds*, Reinhold Pub. Corp., 1923 (ACS Monograph Series No. 15), Chapters 1 and 2. Other procedures are reported by Dehn, *American Chemical Journal*, Vol. 33, pages 120 and 143 (1905); ibid. Vol. 40, pages 113, 117 and 118 (1908). All of the foregoing publications are incorporated herein by reference.

Vapor deposition experiments conducted under comparable conditions in the same equipment using pyrolysis temperatures of approximately 500° C. and pure nitrogen as the carrier gas showed that ethylarsine and propylarsine gave purer arsenic deposits than trimethylarsine. The arsenic deposits from trimethylarsine were spotted with carbonaceous or sooty deposits whereas the coatings from ethylarsine and propylarsine showed no visible evidence of carbon contamination. Ethylarsine and propylarsine are both liquids at room temperature and have strong, pungent, readily detectable odors. They are thus much easier and safer to employ than arsine which as noted above is a gas at temperatures as low as about $-55°$ C.

The following examples illustrate the practice of this invention. In these examples the apparatus employed involved a horizontal glass tube of known weight surrounded by electric heating tape, the tube serving as the pyrolysis chamber. One end of the tube was connected by means of an elbow and a ground glass joint to a round bottom glass flask serving as bubbler for entrainment of the arsenic source material in the carrier gas (nitrogen). A valved dip tube was connected to a nitrogen source so that a stream of nitrogen could be introduced into the flask near the bottom and below the surface of the arsenic source material to effect this entrainment. The other end of the pyrolysis chamber was connected by means of an elbow and ground glass joint to a vertical glass trap cooled by means of dry ice. A side arm from the trap was connected to a bubbler tube to enable the rate of nitrogen flow through the system to be observed visually. Pyrolysis temperatures were measured by means of a thermocouple positioned in a well in the pyrolysis chamber. Thermolysis operations were conducted at substantially atmospheric pressure.

EXAMPLE I

Thermolysis of Propylarsine

A sample (1.36g) of n-propylarsine (produced by Zn-HCl reduction of propyl arsonic acid formed by the general procedure of Quick et al, op. cit.) was vacuum transferred into the round bottom flask and placed under a nitrogen atmosphere. The flask was connected to the above apparatus and the sealed system was flushed with nitrogen. The temperature of the pyrolysis chamber was raised to approximately 500° C. and the nitrogen flow through the system was initiated. Using an external water bath the temperature of the propylarsine in the flask was raised to approximately 40° C. The operation was conducted for a total period of four hours, a profile of the conditions being as follows:

| Total Elasped Time, Hr. | Bubbler Flask Temp., °C. | Pyrolysis Chamber Temp., °C. | Rate of Flow, Bubbles per Minute* |
|---|---|---|---|
| start | 42 | 505.0 | 80 |
| 0.5 | 41 | 508.1 | 82 |
| 1.5 | 38 | 505 6 | 88 |
| 2.5 | 39 | 502.6 | 94 |
| 4.0 | 37 | 501.5 | — |

*As observed in the bubbler tube.

The cooled pyrolysis chamber was weighed in order to determine the weight of arsenic which had been deposited therein during the operation. It contained 0.73 g of arsenic amounting to a yield of 86% of theory. At the end portions of the pyrolysis tube the deposits were in the form of a mirror. No condensates were found in the dry ice trap.

EXAMPLE II

Thermolvsis of Ethylarsine

A 0.98 g sample of ethylarsine (prepared by Zn-HCl reduction of ethyl arsonic acid made according to the method of Quick et al, op. cit.) was subjected to the general thermolysis procedure described in Example I. Because of the higher volatility of ethylarsine as compared to propylarsine, the flask temperature was initially held at zero degrees by means of an ice bath and later on was allowed to reach room temperature. The run lasted 40 minutes during which time the entire sample had been transferred with the nitrogen flow to the pyrolysis chamber. A profile of the conditions used is as follows:

| Total Elapsed Time, min. | Bubbler Flask Temp., °C. | Pyrolysis Chamber Temp., °C. | Comments |
|---|---|---|---|
| start | 0 | 486 | $N_2$ flow initiated |
| 3 | 0 | 495 | Lustrous As deposits formed |
| 5 | 0 | 497 | Thicker As deposits existed |
| 10 | 0 | 495 | About ½ of the $EtAsH_2$ remained in the flask |
| 15 | — | 498 | Ice bath removed from flask |
| 40 | rm. temp. | 500 | Heat turned off |

The pyrolysis chamber was found to contain 0.60 g (87% yield) of a lustrous arsenic deposit.

In contrast, when trimethylarsine was subjected to the above thermolysis procedure the arsenic product and apparatus was spotted with sooty, carbonaceous deposits.

The best modes contemplated for producing III-V films pursuant to this invention are as follows:

Mode A—Using apparatus of the type schematically depicted by R. J. M. Griffiths, *Chemistry and Industry*, 1985, 247-251, in his FIG. 2, n-type gallium arsenide is deposited on a polished crystal of p-type gallium arsenide at 600° C. using trimethyl gallium, ethylarsine, and hydrogen selenide as dopant. Each of these materials is transferred to the pyrolysis chamber using hydrogen as the carrier gas. The pressure in the system is maintained either at atmospheric pressure or at subatmospheric pressures (e.g., as low as 0.1 atmosphere), as desired. The trimethyl gallium bubbler is held at −10° C. and the ethylarsine, likewise held in a stainless steel bubbler, is maintained at 15° C. The hydrogen selenide is introduced as a preformed mixture (100 vpm) with hydrogen. The substrate crystal is positioned on a temperature controlled graphite susceptor heated by radio frequency induction. Flows to the pyrolysis chamber are controlled by means of conventional mass flow controllers so that ethylarsine and trimethylgallium in ratios varifying from 1 to 50, molewise, are fed at rates to achieve a growth rate in the range of 500 to 1,000 angstroms per minute and the hydrogen selenide is introduced at a rate to achieve a dopant level of $10^{17}$ per cubic centimeter. Coatings having thicknesses of up to 100 micrometers are particularly desirable, although greater thicknesses are feasible.

Mode B—Mode A is followed except that p-type gallium arsenide is deposited on gallium arsenide. A bubbler of diethylzinc held at −15° C. is used as the source of the dopant for the deposited film.

Modes C and D—Modes A and B respectively, are followed except that gallium aluminum arsenide is deposited on the gallium arsenide substrate. Thus a portion of the trimethyl gallium fed to the pyrolysis chamber in Modes A and B is replaced by an equal molar quantity of trimethyl aluminum entrained in hydrogen using a stainless steel bubbler of trimethyl aluminum held at 17° C.

Modes E, F, G and H—Modes A through D respectively, are carried out except that propylarsine is used in lieu of ethylarsine and the propylarsine bubbler is held at 30° C.

As noted above, dopants may be used—but need not be—in forming the III-V films pursuant to this invention. Details for such usage are well known and reported in many of the documents incorporated herein by reference.

The substrates used in this invention are preferably compound semiconductors, especially III-V compounds such as single crystal GaAs. However, this process may be applied to producing thin films on appropriate single crystal electrically insulating materials such as sapphire of rhombohedral structure; spinel, thorium oxide, and gadolinium gallium garnet of cubic structure; beryllium oxide of hexagonal structure; chrysoberyl of orthorhombic structure; gallium difluoride; calcium fluoride; and the like. Other substrates include silicon and germanium.

Films which may be produced by use of this invention include arsenic itself and any binary, ternary or quaternary III-V compounds or alloys containing arsenic such as GaAs, InAs, AlAs, $Ga_{1-x}Al_xAs$, $Ga_{l-x}In_xAs$, $Al_{l-x}In_xAs$, $GaAs_xP_{l-x}$, $InAs_xSb_{l-x}$, $Ga_{l-x}In_{x-}As_yP_{1-y}$, and the like. Thus in general, the III-V films may be represented as having the general formula:

$$A_nB_mC_pAs_aM_bN_c$$

where A, B and C are Group III-A elements, M and N are Group V-A elements other than arsenic, n, m, p, b, and c are whole or fractional numbers from and including 0 up to and including 1, a is a number above zero up to and including one, the sum of n, m and p being one and the sum of a, b and c being one. GaAs and $Ga_{l-x}Al_xAs$ alloys are preferred because of their usefulness for high-speed, microwave applications and for optoelectronic applications.

Various inert carrier gases may be used (e.g., hydrogen, argon, helium, neon, nitrogen, etc.). Hydrogen is preferred for use in MOCVD.

The importance pursuant to this invention of using an inert carrier gas with the above-described monoalkylarsines was demonstrated by a set of comparative experiments using propylarsine. In one case arsenic was produced by the pyrolysis procedure reported by Dehn, American Chemical Journal, Vol. 40, pages 117–118 (1908). In another case, arsenic was produced by the process of this invention using hydrogen as a carrier gas. The respective arsenic samples were subjected to carbon analysis using coulometric combustion titration. The results were as follows:

Arsenic from Dehn pyrolysis : 11.8% carbon
Arsenic from MOCVD : 0.96% carbon

This invention is susceptible to considerable variation in its practice within the spirit and scope of the appended claims.

What is claimed is:

1. In a vapor deposition process for producing an arsenic-containing film on a substrate by thermally decomposing at least a vaporous organo arsenic compound upon a heated substrate, the improvement wherein the organo arsenic compound consists essentially of a monoalkylarsine carried to the heated substrate by means of a flow of an inert carrier gas, said monoalkylarsine having up to 3 carbon atoms in the alkyl group.

2. A process of claim 1 conducted at substantially atmospheric pressure.

3. A process of claim 1 wherein the monoalkylarsine is etylarsine or propylarsine.

4. In a vapor deposition process for producing an arsenic-containing film on a substrate by thermally decomposing at least a vaporous organo arsenic compound upon a heated substrate, the improvement wherein the organo arsenic compound is a monoalkylarsine having up to 3 carbon atoms in the alkyl group and is transported at substantially atmospheric or below atmospheric pressure to the heated substrate by means of and in an inert carrier gas.

5. A process of claim 4 wherein the monoalkylarsine is ethylarsine or propylarsine.

6. A process of claim 1 wherein the monoalkylarsine is propylarsine and the carrier gas is hydrogen or nitrogen.

7. A process of claim 4 wherein the monoalkylarsine is propylarsine and the carrier gas is hydrogen or nitrogen.

* * * * *